United States Patent [19]

Yamada

[11] Patent Number: 4,682,271
[45] Date of Patent: Jul. 21, 1987

[54] PRINTED CIRCUIT BOARD AND METHOD FOR FABRICATION THEREOF

[75] Inventor: Kazuhiko Yamada, Tochigi, Japan

[73] Assignee: Kabushiki Kaisha Toshiba, Kawasaki, Japan

[21] Appl. No.: 844,609

[22] Filed: Mar. 27, 1986

[30] Foreign Application Priority Data

Apr. 8, 1985 [JP] Japan ................................. 60-72563

[51] Int. Cl.⁴ ............................................. H05K 1/02
[52] U.S. Cl. ..................................... 361/409; 29/829; 101/129; 174/68.5; 361/397; 430/394; 430/396
[58] Field of Search ................................ 361/397–398, 361/400, 402, 409; 174/68.5; 430/394, 396; 101/114, 129; 29/829, 831–832, 834

[56] References Cited

U.S. PATENT DOCUMENTS

| | | | |
|---|---|---|---|
| 2,751,294 | 6/1956 | Morrison | 430/394 X |
| 3,222,173 | 12/1965 | Belko, Jr. et al. | 29/832 X |
| 3,508,919 | 4/1970 | Reimer | 361/409 X |
| 3,584,376 | 6/1971 | Howe et al. | 29/831 |
| 4,054,091 | 10/1977 | Bradley | 101/115 X |
| 4,409,305 | 10/1983 | Goetschi | 430/394 X |

*Primary Examiner*—Arthur T. Grimley
*Assistant Examiner*—Jane K. Lau

*Attorney, Agent, or Firm*—Oblon, Fisher, Spivak, McClelland & Maier

[57] ABSTRACT

A printed circuit board having a circuit pattern formed on at least one of the first and second faces of a substrate and having characters and symbols representing components to be mounted on said substrate printed on the first face and the second face of the substrate, wherein the characters printed on the first face have been printed in the reversed images in about the corresponding positions of the back face. Since the characters printed on the first face of the printed circuit board are also printed in the reversed images in the immediately corresponding positions of the second face of the board, these characters can be used as indexes to find a particular position on the printed circuit board, and the first or second face can be instantly distinguished from the second or first face. The present invention also provides a method for the fabrication of a printed circuit board comprising the steps of printing on the first face of a substrate which has a circuit pattern formed on at least one of the first and second faces of the substrate with a first printing plate on which characters are disposed, preparing a second printing plate having the reversed character images by turning over the above first printing plate to reverse the normal characters, and printing the reversed character images on the second face of the substrate with the second printing plate.

7 Claims, 6 Drawing Figures

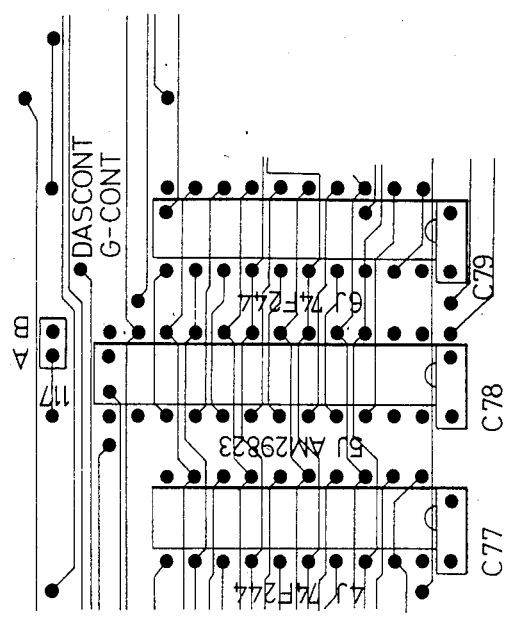
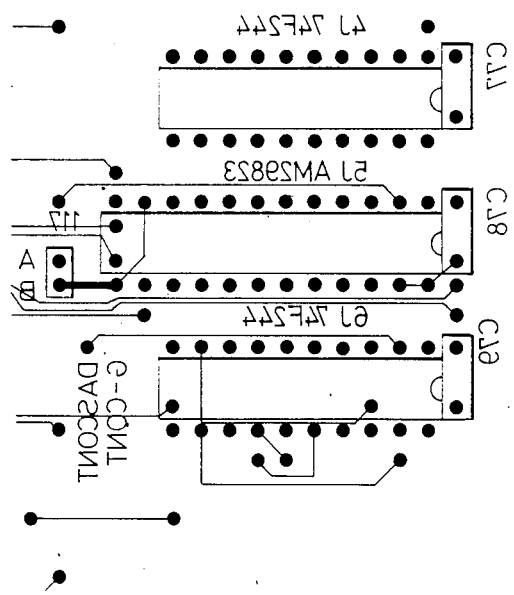
FIG.2(A).
FIG.2(B).

PRINTED CIRCUIT BOARD AND METHOD FOR FABRICATION THEREOF

BACKGROUND OF THE INVENTION

1. Field of the Invention

The present invention relates to a printed circuit board with characters printed on its front and back faces and to a method for the fabrication of the printed circuit board.

2. Discussion of Background

Generally, printed circuit boards are assembled, modified, inspected or adjusted in accordance with the following procedures which take place very frequently. That is, a specific terminal, pattern, or through hole recognized on the front face of a circuit board is required to be found on the back face of the circuit board for its modification or for connecting the probe of a measuring device to it. It is the most time-consuming work to find such a specific position of the front face on the back face of the circuit board. This is because conventional printed circuit boards having cirucit patterns, characters, and symbols printed on their front faces have different circuit patterns, characters and symbols on their back faces. Consequently, to find a position common to the front and back faces of the circuit board it was necessary to use as an index the relation between the position of characters and symbols printed on the front face and that of characters and symbols on the back face. In other words, the common position had to be found depending on an intuition and a "location" which will be described hereinafter.

The above mentioned printing of characters are effected by the method of silk-screen printing. In the silk-screen printing, the patterns of characters and symbols drawn on a negative are photoprinted on a screen such as silk or nylon having numerous meshs or on a stainless steel mesh to prepare a silk printing plate. With this silk printing plate, the characters and symbols are printed on a substrate. The above negative is prepared by manually writing, applying a tape, or printing desired characters and symbols on a transparent sheet. This negative is prepared by forming the characters and symbols by an area which passes light and an area which does not so that the above silk printing plate is prepared by photoprinting.

Accordingly, the conventional silk-screen printing employs a negative shown in FIG. 1(A) to print the characters on the front face of a substrate and a negative shown in FIG. 1(B) on the back face of the substrate. The characters printed by the use of these negatives represent normal images on the front and back faces of the circuit board. Therefore, the characters printed on the printed circuit board do not make indexes which are used to locate a particular position on the printed circuit board. For example, the terminal "+" of an electrolytic capacitor C4 illustrated in FIG. 1(A) is found positioned just below the character "4" of the characters "C4" when observed on the front face, but it is also found just below the character "C" instead of the character "4" when observed on the back face as illustrated in FIG. 1(B). Consequently, when any printed character is used as an index to find a certain position common to the front and back faces of the circuit board, a different position is often located in error. Besides, it takes a long time and a lot of trouble to find such a position.

OBJECT OF THE INVENTION

It is an object of the present invention to provide a printed circuit board which allows to use the characters printed on the first and second faces of the circuit board as indexes for finding a particular position on the circuit board, and which the errors in the assembly, modification, inspection or adjustment of the printed circuit boards are decreased.

Another object of the present invention is to provide a method for fabricating a printed circuit board that greatly decreases a time required to make a negative which is used to print characters on the second face of the board.

SUMMARY OF THE INVENTION

To accomplish the objects of the present invention, the present invention provides a printed circuit board having a circuit pattern formed on at least one of the first and second faces of a substrate and characters and symbols which represent components to be mounted on the substrate and which are printed on the first and the second face of the substrate, wherein the characters and symbols printed on the first face have been printed in the reversed images in substantially the corresponding positions of the second face. Further, the present invention provides a method for the fabrication of a printed circuit board comprising the steps of printing with the first printing plate on which normal characters have been disposed on the first face of a substrate having a circuit pattern formed on at least one of the first and second faces of the substrate, preparing the second printing plate which possesses the reversed characters by turning over the first printing plate possessing the normal characters, and printing the reversed character images on the second face of the substrate with the second printing plate.

BRIEF DESCRIPTION OF THE DRAWINGS

FIG. 2(A) is a plan view partly illustrating the back face of a printed circuit board according to the present invention;

FIG. 2(B) is a plan view partly illustrating the front face of a printed circuit board according to the present invention;

DETAILED DESCRIPTION OF THE PREFERRED EMBODIMENTS

Figure 3:
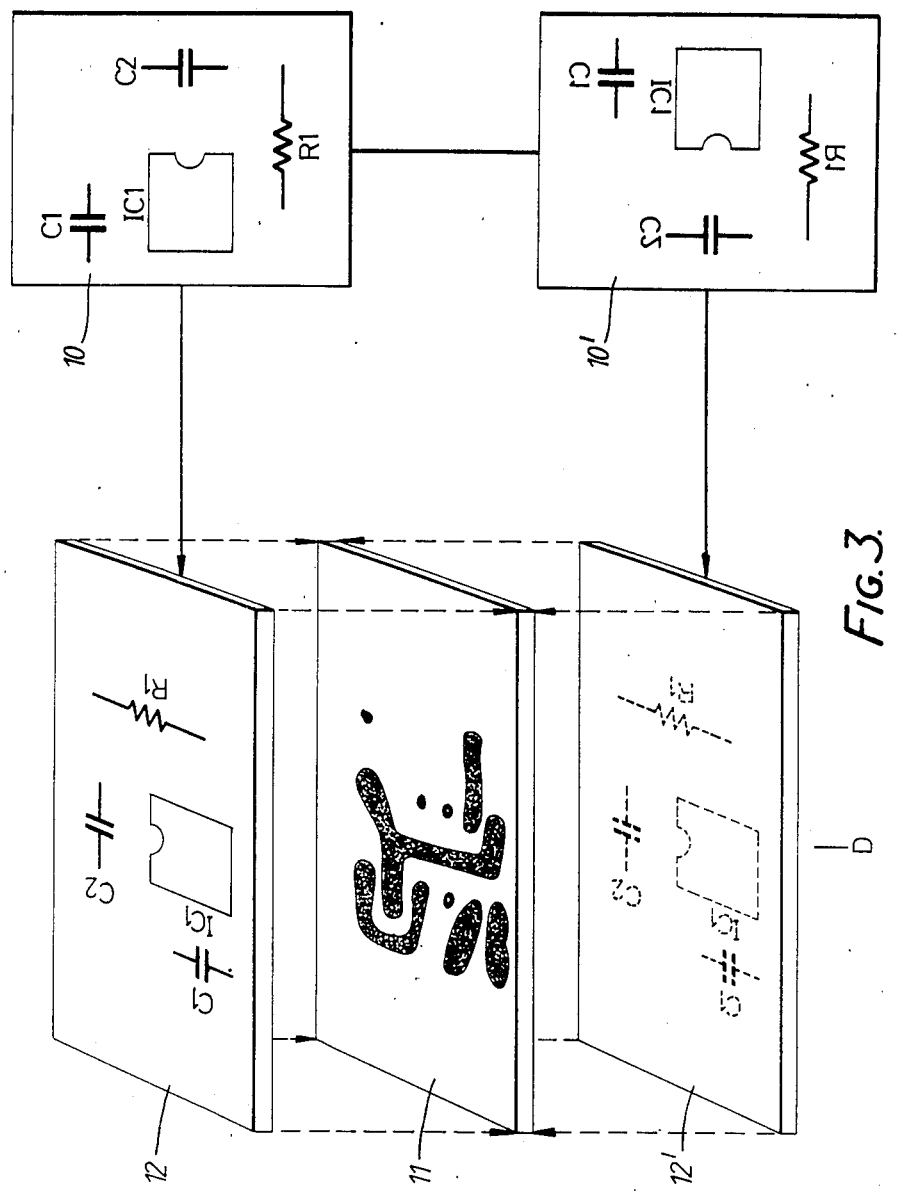
FIG. 3 is a schematic view explaining a method for the fabrication of a printed cirucit board according to the present invention.

One embodiment of the present invention will be described below with reference to FIG. 3.

A substrate 11 has different circuit patterns formed on its front and back faces. On the front face of substrate 11 is effected the silk-screen printing with a silk printing plate 12 which is prepared from a front negative 10. This front negative 10 is made of a transparent sheet such as Mylar (Trade Name) by manually writing symbols which represent capacitors, a resistor, and IC and the corresponding characters such as "C1", "C2", "R1" and "IC1" thereon. These characters may be written by CAD instead of handwriting. Silk printing plate 12 is prepared by exposing and photoprinting the characters and symbols of front negative 10 onto silk or chemical fiber fabric set tight in a metal frame. Then, silk printing plate 12 is placed on substrate 11 and pressed with a roller or a squeegee provided with a rubber blade to force out ink through a part of the silk mesh where the characters and symbols have been written, thereby leaving the images on substrate 11.

On the back face (not shown in FIG. 3) of substrate 11, the silk-screen printing is effected with a silk printing plate 12' which is prepared with a back negative 10'. To prepare this back negative 10' by the use of the front negative 10, front negative 10 is turned over to expose and photoprint the reversed images on a transparent sheet. Consequently, the symbols representing the capacitors, resistor and IC and the characters corresponding to these symbols are printed in the reversed images. As back negative 10', front negative 10 may be used in its reversed form. In this case, the distance for the exposure in the preparation of silk printing plate 12' varies slightly due to the thickness of front negative 10. As a result, silk printing plate 12' prepared has the images slightly out of focus but does not give rise to any problem in actual use. And silk printing plate 12' is prepared in the same manner of exposing and photoprinting as in the preparation of the aforementioned silk printing plate 12. In FIG. 3, the symbol and character images written on silk printing plate 12' do not look reversed because silk printing plate 12' has been illustrated to show its back face. When silk printing plate 12' is observed as indicated by an arrow D, it is clear that the symbol and character images have been written in the reversed images as those seen on back negative 10'. In other words, the symbol and character images are illustrated in a dotted line to show a state that these symbol and character images could be observed as if they were seen through silk printing plate 12'. Then, silk printing plate 12' is placed on the back face (not shown in FIG. 3) of substrate 11 and pressed with a squeegee or roller in the direction as indicated by the arrow D to force out ink through silk printing plate 12', thereby printing the reversed symbol and character images on the back face of substrate 11. As a result, the front face of substrate 11 has the normal character and symbol images printed and the back face of substrate has the reversed characters and symbol images printed.

Figure 1B:
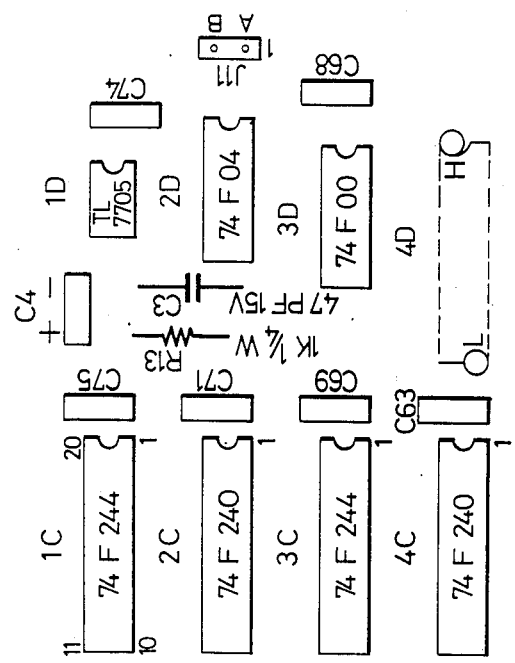
FIG. 1(B) is a plan view of a negative used for printing characters and symbols on the back face of a conventional printed circuit board.
Figure 1A:
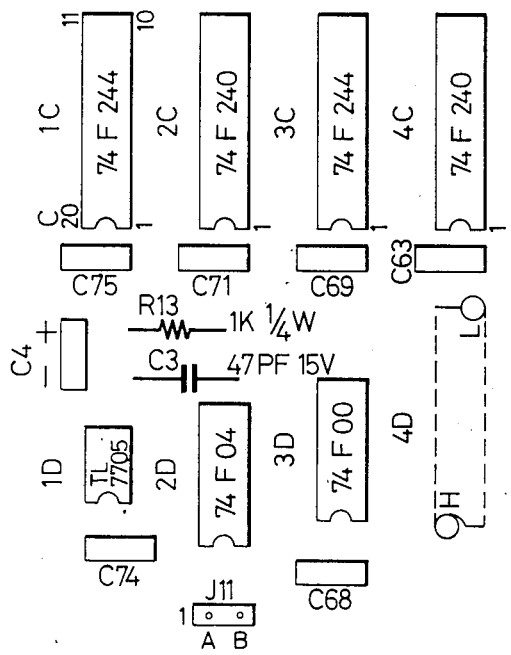
FIG. 1(A) is a plan view of a negative used for printing characters and symbols on the front face of a conventional printed circuit board.
Figure 4:
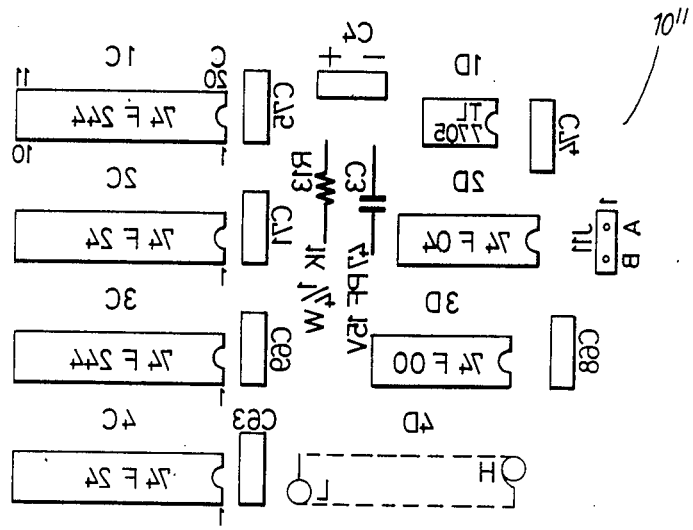
FIG. 4 is a plan view of a back negative used for printing the reversed characters and symbols on the back face of a printed circuit board according to the present invention.

FIG. 4 illustrates another back negative 10'' used in the method for the fabrication of a printed circuit board according to the present invention. This negative 10'' is prepared by the steps of turning over the negative of FIG. 1(A) disclosed in the above Discussion of Background and exposing and photoprinting its character and symbol images on a transparent sheet. Therefore, with this back negative 10'', the reversed character and symbol images are printed on the back face of a substrate.

The characters and symbol images illustrated in FIG. 4 are mainly consisting of component symbols, locations, component names, terminal numbers, ratings and component numbers. Details will be given in the following TABLE. In this specification, the term "location" denotes area names given to areas in the shape of matrix which are formed on the printed circuit board by dividing the board with virtual lines drawn horizontally and vertically at a certain interval (about the size of IC). These areas are given with names such as 1C, 2C, . . . and 1D, 2D, . . . as shown in TABLE.

TABLE

| Component symbol | (IC) | (Capacitor) | (Resistor) | (Capacitor) |
| --- | --- | --- | --- | --- |
| | (Terminal) | (Spare IC) | | |
| Location | 1C, 2C, 3C, 4C, 1D, 2D, 3D, 4D | | | |
| Component name | 74F244, 74F240, 74F04, 74F00 TL7705 | | | |
| Terminal number | Numbers "1", "10", "11" and "20" which are marked around the IC (component name: 74F244) marked on the location IC in FIG. 4. | | | |
| Rating | 1K 1/4W, 47PF 15V | | | |
| Component number | IC1C, IC2C, IC3C, IC4C, IC1D, IC2D, IC3D IC4D, J11, R13, C3, C4, C75, C71, C69, C63 C74, C68 | | | |

Since the circuit pattern has been formed on the substrate in advance, the characters and symbols to be printed by the silk-screen printing are superposed on the circuit pattern. FIGS. 2(A) and 2(B) illustrate embodiments of the printed circuit boards prepared in accordance with the fabrication method of the present invention. They have the character and symbol images superposed on the preformed circuit pattern. FIG. 2(A) illustrates the back face of the printed circuit board and FIG. 2(B) the front face of the same circuit board.

As described above, since the silk-screen printing according to the present invention employs a single negative to print on the front and back faces of a printed circuit board, the identical information is seen transparently in about the corresponding positions of the front and back faces of the printed circuit board. Further, since the single negative makes it possible to print on the front and back faces of the circuit board, the time required to make the negative is greatly decreased and the negative is prepared without errors.

The printed circuit board referred to in the above embodiment has the circuit pattern formed on its front and back faces. The method of the present invention may be applied to a printed circuit board with a circuit pattern formed on one of its faces or with a mulitlayer circuit pattern.

In the present invention, since the characters printed on the first and second faces of the printed circuit board are placed transparently in about the corresponding positions, they can be used as indexes to find a particular position on the circuit board, and the front or back face can be instantly distinguished from the back or front face. Consequently, the time needed in the assembly, modification, inspection or adjustment of the printed circuit boards is shortened and the errors in the assembly, modification, inspection or adjustment of the printed circuit boards are also decreased.

What is claimed as new and desired to be secured by letters patent of the United States is:

1. A printed circuit board having a circuit pattern formed on at least one of the first and second faces of a substrate and having images which represent components to be mounted on said substrate printed on the first face and the second face of said substrate, wherein the images printed on the first face are reversed images of those printed on the second face, and the reversed images are located at positions on said first face corresponding to respective positions of the images on the second face.

2. A method for fabricating a printed circuit board comprising:
- a step of printing with a first printing plate on which first images have been disposed on a first face of a substrate having a circuit pattern formed on at least one of first and second faces of the substrate;
- a step of preparing a second printing plate possessing second images which are the reverse of the first images printed on the first face by turning over said first printing plate to reverse the first images on said first printing plate; and
- a step of printing the second images which are the reverse of said first images on the second face of said substrate with said second printing plate.

3. A method for fabricating a printed circuit board according to claim 2, wherein said first printing plate is made of a screen by exposing and photoprinting the first images on it through a first negative which has been prepared by writing the first images on a transparent sheet.

4. A method for fabricating a printed circuit board according to claim 3, wherein said second printing plate is prepared by turning over said first negative, exposing and photoprinting the reversed second images of said first negative on a transparent sheet to make a second negative, and exposing and photoprinting the reversed second images of said second negative on a screen.

5. A method for fabricating a printed circuit board according to claim 4, wherein said step of printing the reversed second images on the second face is effected by placing said second printing plate of screen on the second face of said substrate and applying ink through the screen where the reversed second images have been disposed.

6. A method for fabricating a printed circuit board according to claim 3, wherein said second printing plate is prepared by turning over said first negative to be used as a second negative and exposing and photoprinting the reversed second images of said second negative on a screen.

7. A method for fabricating a printed circuit board according to claim 6, wherein said step of printing the reversed second images on the second face is effected by placing said second printing plate of screen on the second face of said substrate and applying ink through the screen where the reversed second images have been disposed.

* * * * *